United States Patent
Wen et al.

(10) Patent No.: US 12,512,359 B2
(45) Date of Patent: Dec. 30, 2025

(54) WAFER JIG, WAFER STRUCTURE AND WAFER PROCESSING METHOD

(71) Applicant: GlobalWafers Co., Ltd., Hsinchu (TW)

(72) Inventors: Chan-Ju Wen, Hsinchu (TW); Chia-Chi Tsai, Hsinchu (TW); Han-Zong Wu, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 581 days.

(21) Appl. No.: 17/858,082

(22) Filed: Jul. 6, 2022

(65) Prior Publication Data

US 2023/0126487 A1  Apr. 27, 2023

(30) Foreign Application Priority Data

Oct. 22, 2021 (TW) ................. 110139201

(51) Int. Cl.
*H01L 21/683* (2006.01)
*H01L 21/02* (2006.01)
*H10D 62/832* (2025.01)

(52) U.S. Cl.
CPC .... *H01L 21/6835* (2013.01); *H01L 21/02378* (2013.01); *H10D 62/8325* (2025.01); *H01L 2221/68313* (2013.01)

(58) Field of Classification Search
CPC ........... H01L 21/6835; H01L 21/02378; H01L 29/1608; H01L 2221/68313; H01L 21/7806; H01L 2221/68381
USPC ........................................................ 438/458
See application file for complete search history.

(56) References Cited

U.S. PATENT DOCUMENTS

| | | | | |
|---|---|---|---|---|
| 7,048,316 B1* | 5/2006 | Blank | ............... | H01L 21/68707 294/902 |
| 7,956,447 B2* | 6/2011 | Enquist | ............. | H01L 21/67333 414/940 |
| 8,141,926 B2* | 3/2012 | Fujii | ................. | H01L 21/67742 414/941 |
| 8,567,837 B2* | 10/2013 | Chang | ................. | H01L 21/6875 294/213 |
| 8,980,001 B2* | 3/2015 | Sakurai | ................... | C30B 29/06 118/724 |
| 9,847,235 B2* | 12/2017 | von Koblinski | ...... | H01L 23/492 |
| 10,163,765 B2* | 12/2018 | Happoya | ........... | H01L 23/49579 |
| 10,208,398 B2* | 2/2019 | Muto | .................... | C30B 25/165 |

FOREIGN PATENT DOCUMENTS

TW   M359788   6/2009

* cited by examiner

*Primary Examiner* — Vu A Vu
(74) *Attorney, Agent, or Firm* — JCIPRNET

(57) ABSTRACT

Provided is a wafer jig including a bottom wall and a ring-shaped side wall. The bottom wall has a supporting surface. The ring-shaped side wall is connected to a periphery of the bottom wall. The ring-shaped side wall includes at least two step portions. The two step portions include a first step portion and a second step portion. The first step portion is connected between the supporting surface and the second step portion, and the first step portion protrudes along a direction toward a center of the bottom wall. The ring-shaped side wall surrounds the center. In addition, a wafer structure and a wafer processing method are also provided.

4 Claims, 4 Drawing Sheets

WAFER JIG, WAFER STRUCTURE AND WAFER PROCESSING METHOD

CROSS-REFERENCE TO RELATED APPLICATION

This application claims the priority benefits of Taiwan application serial no. 110139201, filed on Oct. 22, 2021. The entirety of the above-mentioned patent application is hereby incorporated by reference herein and made a part of this specification.

BACKGROUND

Technical Field

The present disclosure is related to a jig, a structure including the jig, and a processing method, particularly to a wafer jig, a wafer structure including the wafer jig, and a wafer processing method.

Description of Related Art

As silicon carbide is a pricy material, it is critical to thin silicon carbide wafers and process the silicon carbide material into as many silicon carbide wafers as possible. However, thinned silicon carbide wafers are prone to warping which results in poor yield and may be damaged easily during transportation and processing. In addition, wafers of a certain dimension (such as a 6-inch wafer) may not meet the specifications of subsequent processing equipment (such as an epitaxy machine that corresponds to the specification of an 8-inch wafer) and have the issue of compatibility with the machines.

SUMMARY

The present disclosure provides a wafer jig, a wafer structure, and a wafer processing method capable of preventing the deformation and damage of the wafer and solving the problem of incompatibility between the wafer and the machine.

The wafer jig of the disclosure includes a bottom wall and a ring-shaped side wall. The bottom wall has a supporting surface. The ring-shaped side wall is connected to the periphery of the bottom wall, and the ring-shaped side wall includes at least two step portions. The two step portions include a first step portion and a second step portion. The first step portion is connected between the supporting surface and the second step portion, and the first step portion protrudes toward the center of the bottom wall with respect to the second step portion. The ring-shaped side wall surrounds the center.

In an embodiment of the disclosure, the ring-shaped side wall forms an accommodating space on the bottom wall, the accommodating space includes a first subspace and a second subspace, the first subspace corresponds to the first step portion, the second subspace corresponds to the second step portion, and the dimension of the second subspace in a first direction parallel to a protruding direction of the first step portion toward the center is larger than the dimension of the first subspace in the first direction.

In an embodiment of the disclosure, the dimension of the first subspace in a second direction perpendicular to the first direction is smaller than the thickness of the wafer, the dimension of the first subspace and the second subspace in the second direction is smaller than the thickness of the wafer, and the sum of the dimensions is greater than or equal to the thickness of the wafer.

In an embodiment of the disclosure, the hardness of the bottom wall and the ring-shaped side wall is smaller than the hardness of the wafer.

In an embodiment of the disclosure, the supporting surface includes a bottom surface and an inclined surface, and the inclined surface is connected between the bottom surface and the first step portion and is inclined to the bottom surface.

The wafer structure of the disclosure includes a wafer jig and a wafer. The wafer jig includes a bottom wall and a ring-shaped side wall. The bottom wall has a supporting surface. The ring-shaped side wall is connected to the periphery of the bottom wall, and the ring-shaped side wall includes at least two step portions. The step portions include a first step portion and a second step portion. The first step portion is connected between the supporting surface and the second step portion, and the first step portion protrudes toward the center of the bottom wall with respect to the second step portion. The ring-shaped side wall surrounds the center. The wafer is carried on the supporting surface. A side edge of the first step portion and a side edge of the second step portion face the wafer. The periphery of the wafer contacts the side edge of the first step portion, and a gap exists between the periphery of the wafer and the side edge of the second step portion.

In an embodiment of the disclosure, the ring-shaped side wall forms an accommodating space on the bottom wall, the accommodating space includes a first subspace and a second subspace, the first subspace corresponds to the first step portion, the second subspace corresponds to the second step portion, and the dimension of the second subspace in a first direction parallel to a protruding direction of the first step portion toward the center is larger than the dimension of the first subspace in the first direction.

In an embodiment of the disclosure, the dimension of the first subspace in a second direction perpendicular to the first direction is smaller than the thickness of the wafer, and the sum of the dimension of the first subspace and a dimension of the second subspace in the second direction is greater than or equal to the thickness of the wafer.

In an embodiment of the disclosure, the hardness of the bottom wall and the ring-shaped side wall is smaller than the hardness of the wafer.

In an embodiment of the disclosure, the supporting surface includes a bottom surface and an inclined surface, and the inclined surface is connected between the bottom surface and the first step portion and is inclined to the bottom surface.

The wafer processing method of the disclosure includes the following processes. A wafer jig is provided, and the wafer jig includes a bottom wall and a ring-shaped side wall. The bottom wall has a supporting surface. The ring-shaped side wall includes at least two step portions. The step portions include a first step portion and a second step portion. The first step portion is connected between the supporting surface and the second step portion, and the first step portion protrudes toward the center of the bottom wall with respect to the second step portion. The ring-shaped side wall surrounds the center. A wafer is bonded to the supporting surface, in which the periphery of the wafer contacts the first step portion, and a gap exists between the periphery of the wafer and the second step portion. The epitaxy process is performed on the wafer. And, the wafer is separated from the wafer jig.

In an embodiment of the disclosure, bonding the wafer to the supporting surface includes bonding the wafer to the supporting surface by performing a thermocompression bonding process or an oxide layer bonding process.

In an embodiment of the disclosure, separating the wafer from the wafer jig includes: cutting the wafer jig to remove the second step portion and at least a part of the first step portion; forming an adhesive layer on the epitaxial wafer; and removing a part of the wafer and the wafer jig by a grinding process or a laser process.

In an embodiment of the disclosure, bonding the wafer to the supporting surface includes bonding the wafer to the supporting surface through an oxide layer bonding process, and separating the wafer from the wafer jig includes removing an oxide layer between the wafer and the wafer jig. The wafer processing method further includes thinning the wafer after the wafer is separated from the wafer jig.

In an embodiment of the disclosure, separating the wafers from the wafer jig includes separating a part of the wafers from the wafer jig by performing a laser process. And the wafer processing method further includes removing another part of the wafer remaining on the wafer jig after the part of the wafer is separated from the wafer jig.

Based on the above, the wafer jig of the disclosure is adapted to stably support the wafer to prevent the wafer from warping and having poor yield and from being broken and damaged during transportation and processing. In addition, as the first step portion of the ring-shaped side wall protrudes toward the center of the bottom wall with respect to the second step portion, there is a gap between the wafer and the second step portion when the wafer is placed on the bottom wall and surrounded by the first step portion. The gap serves as a buffer space to reduce the probability of the wafer being broken due to impact force. In addition, when the epitaxy process is performed on the wafer, the spacing is able to prevent the wafer and the wafer jig from being connected through the epitaxial layer after the epitaxy process is completed, as a way to prevent the wafer from being broken when it gets difficult to separate the wafer from the wafer jig and/or when the edge of the wafer is separated from the wafer jig. Furthermore, the wafer jig of the disclosure and the wafer together constitute a wafer structure, in which the dimension of this wafer structure (that is, the dimension of the wafer jig, which may be 8 inches, for example) is larger than the dimension of the wafer itself (6 inches, for example). Accordingly, even if the processing equipment (e.g., epitaxy machine) corresponds to a specification (of 8-inch wafers, for example) incompatible with the dimension of the wafer itself, the wafer structure constituted by the wafer jig and the wafer is still compatible with the specifications of the processing equipment.

DESCRIPTION OF THE EMBODIMENTS

Figure 1:
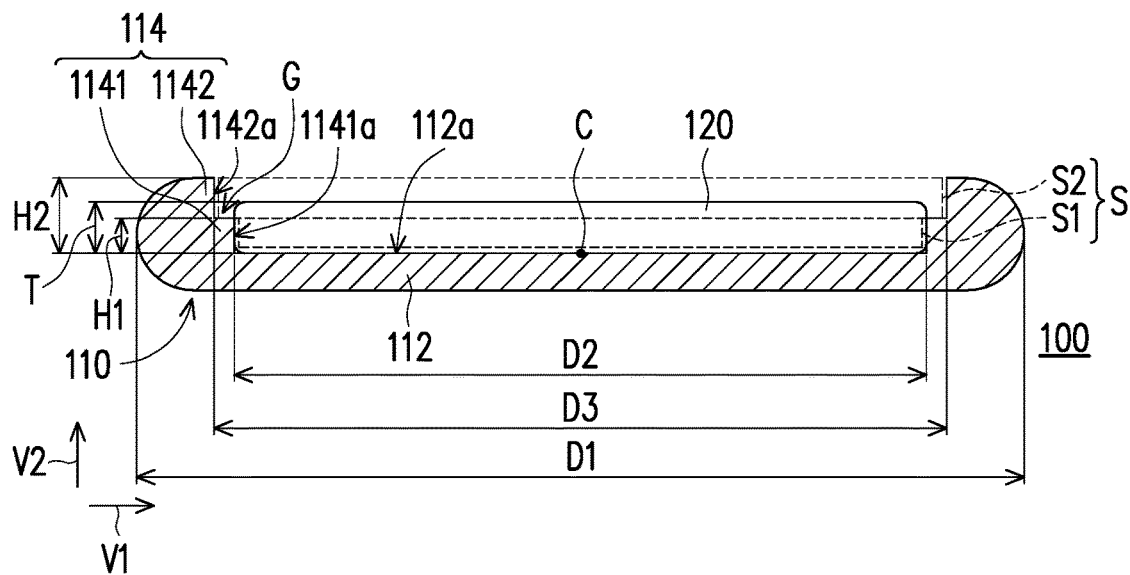
FIG. 1 is a schematic cross-sectional view of a wafer structure according to an embodiment of the disclosure.
Figure 2:
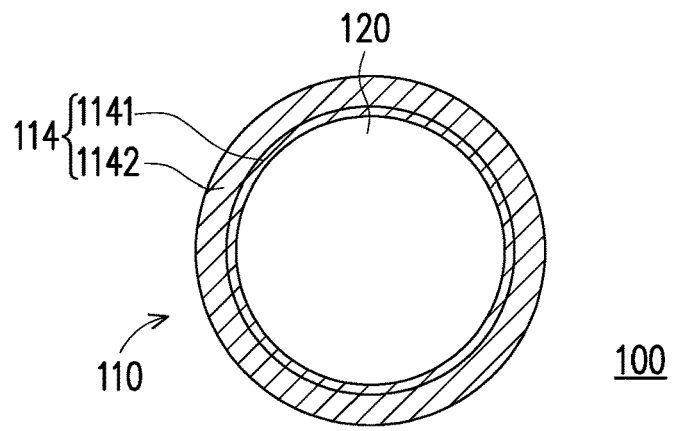
FIG. 2 is a schematic top view of the wafer structure of FIG. 1.

FIG. 1 is a schematic cross-sectional view of a wafer structure according to an embodiment of the disclosure. FIG. 2 is a schematic top view of the wafer structure of FIG. 1. As shown in FIG. 1 and FIG. 2, the wafer structure 100 of this embodiment includes a wafer jig 110 and a wafer 120. The wafer jig 110 includes a bottom wall 112 and a ring-shaped side wall 114. The bottom wall 112 has a supporting surface 112a, and the supporting surface 112a carries the wafer 120 bonded to the supporting surface 112a. The ring-shaped side wall 114 is connected to the periphery of the bottom wall 112 and surrounds the center C (marked in FIG. 1) of the bottom wall 112.

The ring-shaped side wall 114 includes at least two step portions (marked as a first step portion 1141 and a second step portion 1142). The first step portion 1141 is connected between the supporting surface 112a of the bottom wall 112 and the second step portion 1142. The first step portion 1141 protrudes toward the center C of the bottom wall 112 with respect to the second step portion 1142. A side edge 1141a of the first step portion 1141 and a side edge 1142a of the second step portion 1142 face the wafer 120. The periphery of the wafer 120 contacts the side edge 1141a of the first step portion 1141, and a gap G exists between the periphery of the wafer 120 and the side edge 1142a of the second step portion 1142. In other words, the second step portion 1142 does not contact the wafer 120. In other embodiments, the ring-shaped side wall 114 may include more step portions, as the disclosure does not limit the quantity thereof.

Specifically, the ring-shaped side wall 114 forms an accommodating space S on the bottom wall 112, and the accommodating space S includes a first subspace S1 and a second subspace S2. The first subspace S1 corresponds to the first step portion 1141, and the second subspace S2 corresponds to the second step portion 1142. The dimension D3 of the second subspace S2 in a first direction V1 parallel to the protruding direction of the first step portion 1141 toward the center C is larger than the dimension D2 of the first subspace S1 in the first direction V1. The dimension H1 of the first subspace S1 in a second direction V2 perpendicular to the first direction V1 is smaller than the thickness T of the wafer 120. The sum (marked as dimension H2) of the dimensions of the first subspace S1 and the second subspace S2 in the second direction V2 is greater than or equal to the thickness T of the wafer 120. In this way, the wafer 120 is able to be completely accommodated in the accommodating space S and the gap G may be formed between the wafer 120 and the second step portion 1142 as described above. In this embodiment, the difference between the dimension D3 of the second subspace S2 in the first direction V1 and the dimension D2 of the first subspace S1 in the first direction V1 is, for example, greater than or equal to 0.4 mm.

With the above configuration, the wafer jig 110 is able to stably support the wafer 120, preventing the wafer 120 from deformation and warpage that result in poor yield and from being broken and damaged during transportation and processing. In addition, the first step portion 1141 of the ring-shaped side wall 114 protrudes toward the center C of the bottom wall 112 with respect to the second step portion 1142 as described above, such that there is a gap G between the wafer 120 and the second step portion. The gap G serves as a buffer space to reduce the probability of the wafer 120 being broken due to the impact force.

The wafer jig 110 and the wafer 120 of this embodiment together constitute the wafer structure 100 as described above. The dimension D1 of the wafer structure 100 (i.e., the dimension of the wafer jig 110, which may be 8 inches, for example) is larger than the dimension D2 of the wafer 120 itself (6 inches, for example). Accordingly, even if the processing equipment (e.g., epitaxy machine) corresponds to a specification (of 8-inch wafers, for example) incompatible with the dimension of the wafer itself, the wafer structure 100 constituted by the wafer jig 110 and the wafer 120 is still compatible with the specifications of the processing equipment.

In this embodiment, the side edge 1141a of the first step portion 1141 is, for example, perpendicular to the first direction V1 (i.e., the protruding direction of the first step portion 1141 toward the center C) to surround and hold the wafer 120 well. In addition, the side edge 1142a of the second step portion 1142 is, for example, perpendicular to the first direction V1 (i.e., the protruding direction of the first step portion 1141 toward the center C) to prevent the side edge 1142a of the second step portion 1142 inclined toward the wafer 120 from getting too close to the wafer 120.

Figure 3:
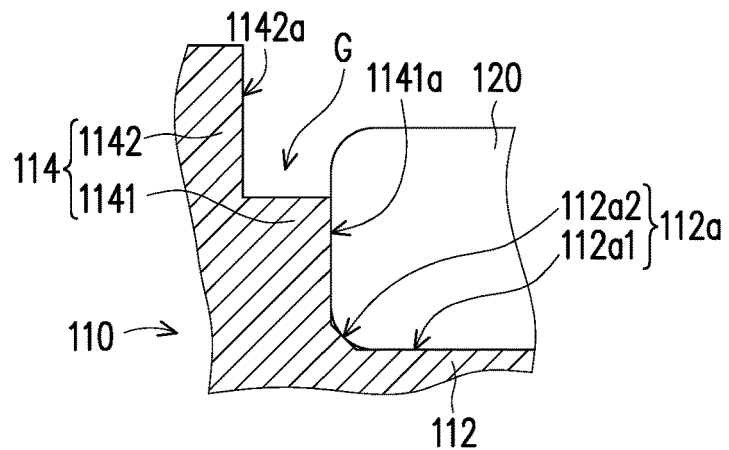
FIG. 3 is a partial schematic diagram of a wafer structure according to another embodiment of the disclosure.

FIG. 3 is a partial schematic diagram of a wafer structure according to another embodiment of the disclosure. The differences between the embodiment shown in FIG. 3 and the embodiment shown in FIG. 1 are described as follows: in the wafer jig 110 of FIG. 3, the supporting surface 112a of the bottom wall 112 includes a bottom surface 112a1 and an inclined surface 112a2, and the inclined surface 112a2 is connected between the bottom surface 112a1 and the first step portion 1141 and is inclined to the bottom surface 112a1. The inclined surface 112a2 is adapted to contact the outer edge of the bottom of the wafer 120, making the supporting surface 112a more closely fit to the chamfer at the bottom outer edge of the wafer 120, as a way to support the wafer 120 more stably and provide better protection of the wafer jig 110 for the wafer 120 and prevent the wafer 120 from having warpage during the subsequent epitaxy process. The inclined surface 112a2 may be a plane as shown in FIG. 3, but in other embodiments, the inclined surface 112a2 can also be formed as an arc surface, such that the inclined surface 112a2 is able to better fit the wafer 120 according to the chamfered shape at the outer edge of the bottom of the wafer 120.

In this embodiment, the bottom wall 112 and the ring-shaped side wall 114 of the wafer jig 110 are integrally formed. In this way, the wafer jig 110 may be easily fabricated from the same base material, and the manufacturing process thereof is able to be simplified. Moreover, the bottom wall 112 and the ring-shaped side wall 114 may have good structural strength when integrally formed.

In the aforementioned embodiment, the material of the wafer jig 110 may include material such as silicon, sapphire, etc. whose hardness is smaller than that of the wafer 120. Therefore, the hardness of the bottom wall 112 and the ring-shaped side wall 114 is smaller than that of the wafer 120, such that the wafer 120 may be prevented from being scratched by the bottom wall 112 and the ring-shaped side wall 114. The processing method of the wafer 120 is described below.

Figure 4A:
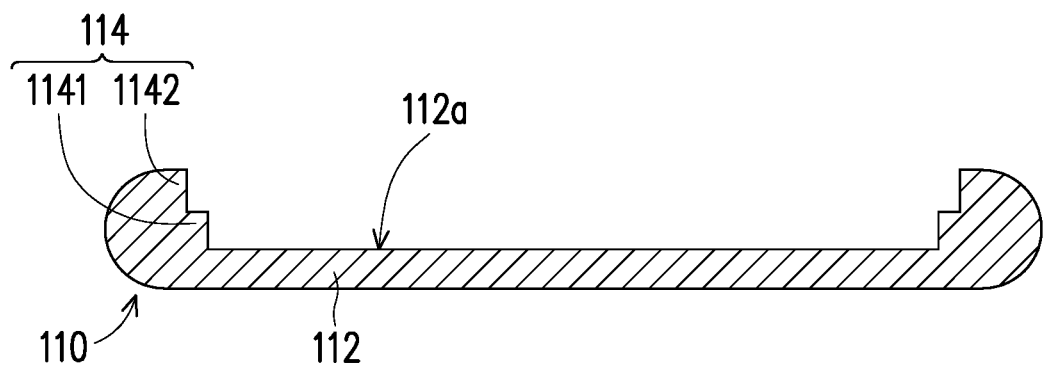
FIG. 4A to FIG. 4G show a process flow of a wafer processing method according to an embodiment of the disclosure.
Figure 4B:
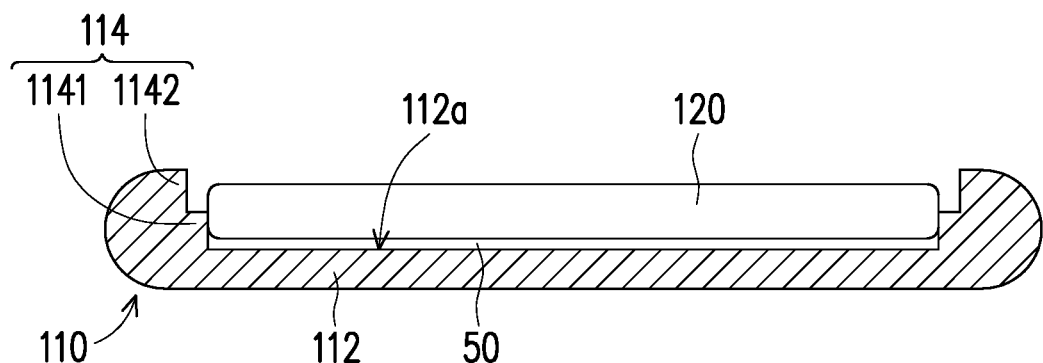

FIG. 4A to FIG. 4F show a process flow of a wafer processing method according to an embodiment of the disclosure. First, as shown in FIG. 4A, the wafer jig 110 shown in FIG. 1 is provided. Next, as shown in FIG. 4B, a wafer 120 is bonded to a supporting surface 112a through an oxide layer bonding process, such that the periphery of the wafer 120 contacts a first step portion 1141 and a gap G exists between the periphery of the wafer 120 and the second step portion 1142. Since the wafer 120 is bonded to the supporting surface 112a through an oxide layer bonding process, the wafer 120 and the supporting surface 112a form an oxide bonding layer 50. Note that the oxide bonding layer 50 is omitted for the sake of simplicity in FIG. 1. In other embodiments, the oxide bonding process may be replaced by a thermocompression bonding process or other processes.

Figure 4C:
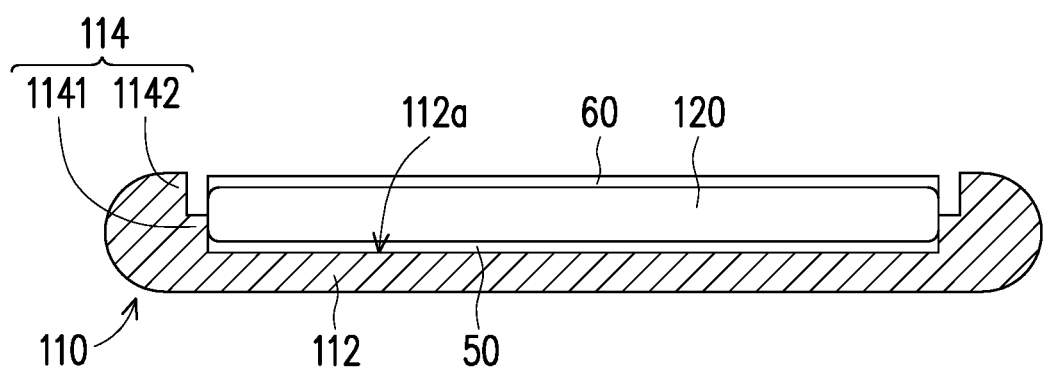

As shown in FIG. 4C, an epitaxial layer 60 is formed by performing the epitaxy process on the wafer 120 by metal-organic chemical vapor deposition (MOCVD) or other suitable epitaxial processes. During the epitaxial process of the wafer 120, the gap G between the wafer 120 and the second step portion 1142 prevents the wafer 120 and the wafer jig 110 from being connected through the epitaxial layer 60 after the epitaxy process is completed, as a way to prevent the wafer 120 from being broken when it gets difficult to separate the wafer 120 from the wafer jig 110 and/or when the edge of the wafer 120 is separated from the wafer jig 110. The process of separating the wafer 120 from the wafer jig 110 is described as follows.

Figure 4D:
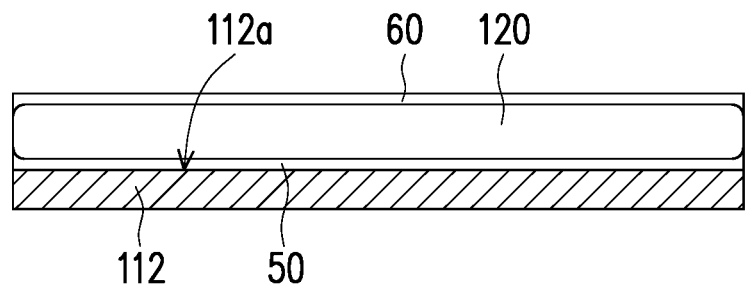
Figure 4E:
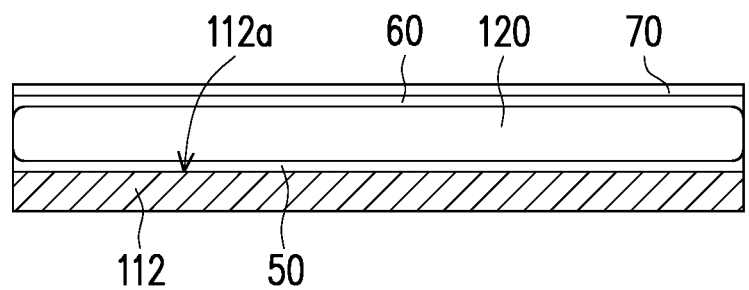
Figure 4F:
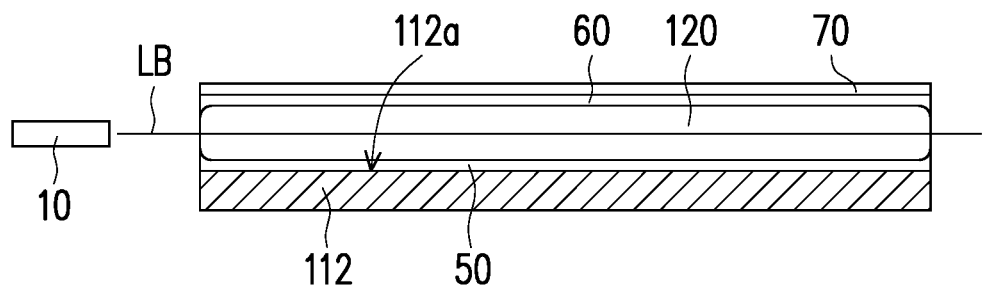
Figure 4G:

As shown in FIG. 4D, the wafer jig 110 has been cut to remove the second step portion 1142 and the first step portion 1141, and as shown in FIG. 4E, an adhesive layer 70 is formed on the epitaxial wafer 120. Details for other subsequent processes related to the wafer 120 such as the adhesive layer 70 are not described herein for the sake of simplicity. Next, as shown in FIG. 4F to FIG. 4G, part of the wafer 120 and the wafer jig 110 are removed by a laser process. The laser light LB emitted by the laser source 10 shown in FIG. 4F is adapted to cut the wafer 120. The separation of the wafer 120 from the wafer jig 110 has been completed so far. In other embodiments, the laser process may be replaced by a grinding process to remove part of the wafer 120 and the wafer jig 110.

As the wafer jig 110 is cut and/or ground during the above process, the wafer jig 110 cannot be recycled. If the wafer jig 110 is to be recovered, the wafer 120 and the wafer jig 110 may be separated not by cutting and/or grinding the wafer jig 110, but by adopting an acidic solution to remove the oxide bonding layer 50 between the wafer 120 and the wafer jig 110 as a way to separate the wafer 120 from the wafer jig 110 before the wafer 120 is thinned to a desired thickness by grinding. In addition, the laser light may also be adapted to directly cut the wafer 120 without cutting the wafer jig 110 to separate the wafer 120 from the wafer jig 110, a process that is described in detail below.

Figure 5A:
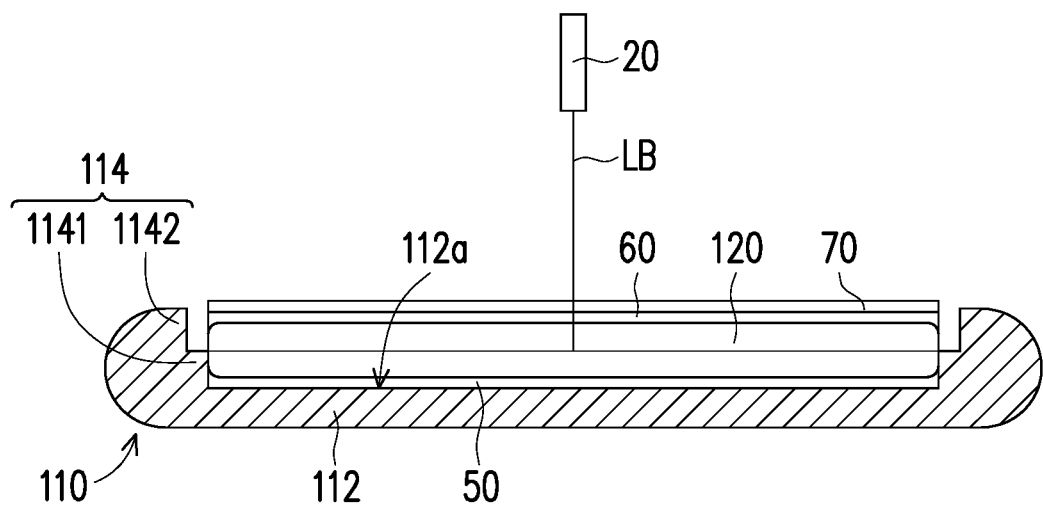
FIG. 5A to FIG. 5B show a partial process flow of a wafer processing method according to another embodiment of the disclosure.
Figure 5B:
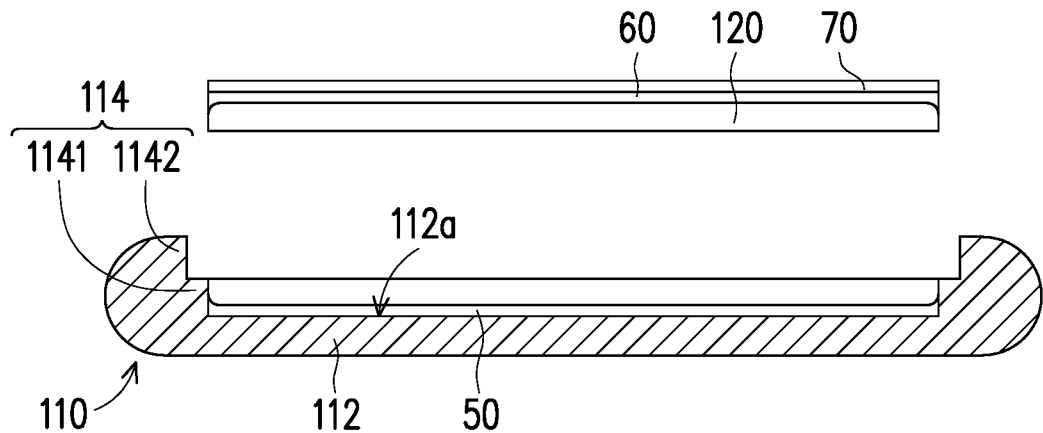

FIG. 5A to FIG. 5B show a partial process flow of a wafer processing method according to another embodiment of the disclosure. After the process shown in FIG. 4C is completed and the adhesive layer 70 is formed, a part of the wafer 120 may be separated from the wafer jig 110 by a laser process as shown in FIG. 5A to FIG. 5B. The laser light LB' emitted by the laser source 20 shown in FIG. 5A is adapted to cut the wafer 120 without cutting the wafer jig 110. Next, another part of the wafer 120 and the oxide bonding layer 50 remaining on the wafer jig 110 are removed, such that the wafer jig 110 is able to be recovered and reused.

To sum up, the wafer jig of the disclosure is adapted to stably support the wafer to prevent the wafer from warping and having poor yield and from being broken and damaged during transportation and processing. In addition, as the first step portion of the ring-shaped side wall protrudes toward the center of the bottom wall with respect to the second step portion, there is a gap between the wafer and the second step portion when the wafer is placed on the bottom wall and surrounded by the first step portion. The gap serves as a buffer space to reduce the probability of the wafer being broken due to impact force. In addition, when the epitaxy process is performed on the wafer, the spacing is able to prevent the wafer and the wafer jig from being connected through the epitaxial layer after the epitaxy process is completed, as a way to prevent the wafer from being broken when it gets difficult to separate the wafer from the wafer jig and/or when the edge of the wafer is separated from the wafer jig. Furthermore, the wafer jig of the disclosure and the wafer together constitute a wafer structure, in which the dimension of this wafer structure (that is, the dimension of the wafer jig, which may be 8 inches, for example) is larger than the dimension of the wafer itself (6 inches, for example). Accordingly, even if the processing equipment (e.g., epitaxy machine) corresponds to a specification (of 8-inch wafers, for example) incompatible with the dimension of the wafer itself, the wafer structure constituted by the wafer jig and the wafer is still compatible with the specifications of the processing equipment.

What is claimed is:

1. A wafer processing method, comprising:
    providing a wafer jig, wherein the wafer jig comprises a bottom wall and a ring-shaped side wall, the bottom wall has a supporting surface, the ring-shaped side wall comprises at least two step portions, the at least two step portions comprise a first step portion and a second step portion, the first step portion is connected between the supporting surface and the second step portion, the first step portion protrudes toward a center of the bottom wall with respect to the second step portion, and the ring-shaped side wall surrounds the center;
    bonding a wafer to the supporting surface, wherein a periphery of the wafer contacts the first step portion, and a gap exists between the periphery of the wafer the second step portion;
    performing an epitaxy process on the wafer; and
    separating the wafer from the wafer jig,
    wherein the bonding the wafer to the supporting surface comprises bonding the wafer to the supporting surface by performing a thermocompression bonding process or an oxide layer bonding process.

2. The wafer processing method according to claim 1, wherein the separating the wafer from the wafer jig comprises:
    cutting the wafer jig to remove the second step portion and at least a part of the first step portion;
    forming an adhesive layer on the epitaxial wafer; and
    removing a part of the wafer and the wafer jig by a grinding process or a laser process.

3. The wafer processing method according to claim 1, wherein bonding the wafer to the supporting surface comprises bonding the wafer to the supporting surface through an oxide layer bonding process, the separating the wafer from the wafer jig comprises removing an oxide layer between the wafer and the wafer jig, and the wafer processing method further comprises:
    thinning the wafer after the wafer is separated from the wafer jig.

4. The wafer processing method according to claim 1, wherein the separating the wafer from the wafer jig comprises separating a part of the wafer from the wafer jig by performing a laser process, and the wafer processing method further comprises:
    removing another part of the wafer remaining on the wafer jig after the part of the wafer is separated from the wafer jig.

* * * * *